United States Patent [19]

Black, Jr.

[11] Patent Number: 4,633,226

[45] Date of Patent: Dec. 30, 1986

[54] MULTIPLE CHANNEL ANALOG-TO-DIGITAL CONVERTERS

[76] Inventor: William C. Black, Jr., 2131 Country Club Pkwy., Cedar Rapids, Iowa 52403

[21] Appl. No.: 682,159

[22] Filed: Dec. 17, 1984

[51] Int. Cl.$^4$ .......................... H03K 13/08; H03K 3/86
[52] U.S. Cl. .................................. 340/347 AD; 328/55
[58] Field of Search ................. 340/347 AD, 347 SH; 307/260, 262, 269, 511; 328/55, 62, 105–106, 155

[56] References Cited

U.S. PATENT DOCUMENTS

| | | | |
|---|---|---|---|
| 2,876,418 | 3/1959 | Villars | 340/347 M |
| 3,500,381 | 3/1970 | Lenway | 340/347 AD |
| 3,622,809 | 11/1971 | Williams | 328/55 |
| 4,023,110 | 5/1977 | Oliver | 328/109 |
| 4,124,820 | 11/1978 | Arhstein | 328/55 |
| 4,276,543 | 6/1981 | Miller | 346/347 AD |
| 4,318,080 | 3/1982 | Yoshida | 340/347 AD |
| 4,417,233 | 11/1983 | Inoues et al. | 340/347 AD |
| 4,479,216 | 10/1984 | Krambeck et al. | 307/269 X |

OTHER PUBLICATIONS

W. C. Black, Jr., "Time Interleaved Converter Arrays", IEEE Journal of Solid State Circuits", vol. SC15, No. 6, Dec. 1980, pp. 1022–1029.

*Primary Examiner*—Vit W. Miska
*Attorney, Agent, or Firm*—Kinney & Lange

[57] ABSTRACT

An arrangement for reducing error in an interleaved analog-to-digital signal conversion system. The arrangement provides matching and adjustment certainty as the basis for such error reduction.

37 Claims, 14 Drawing Figures

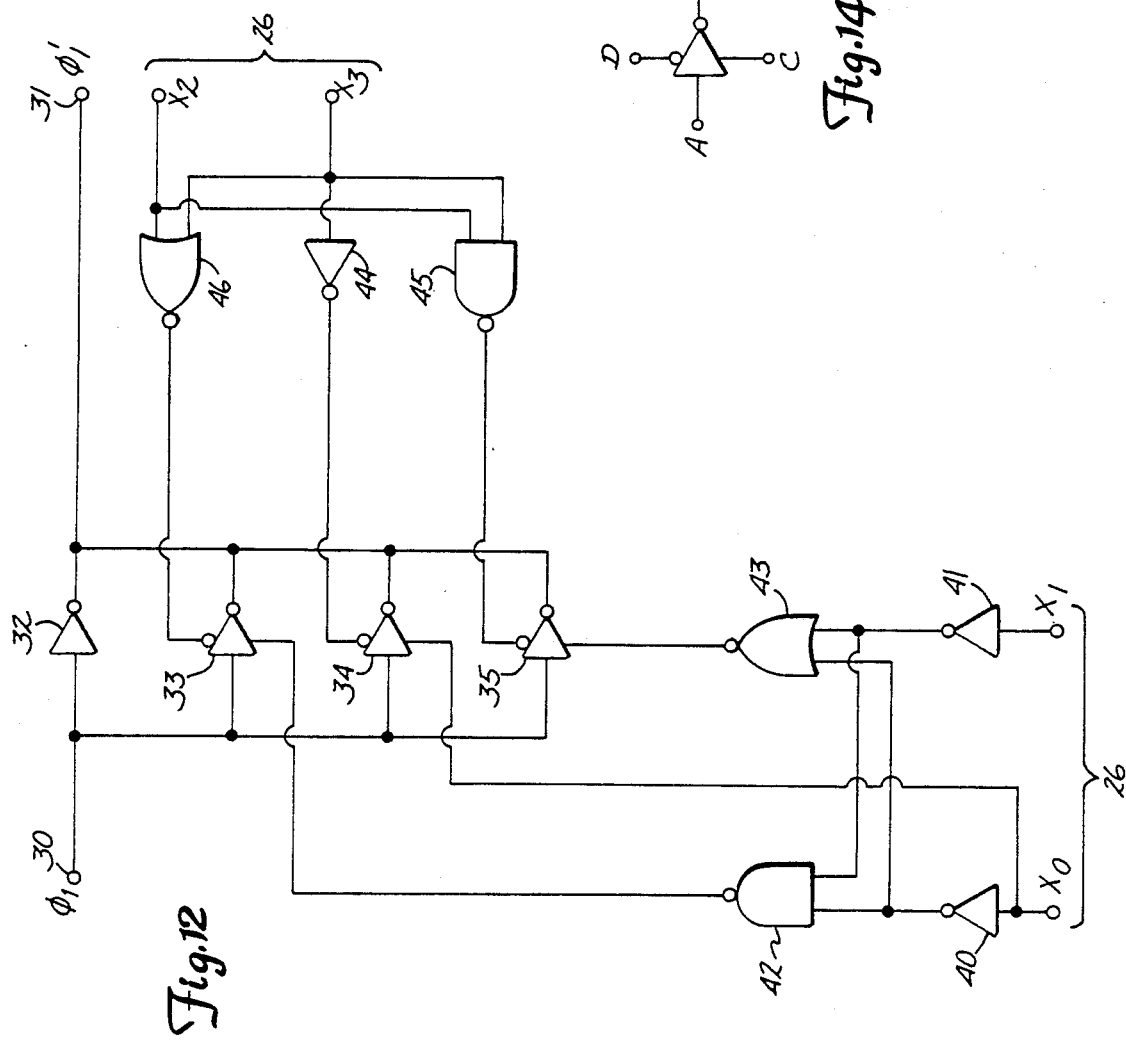
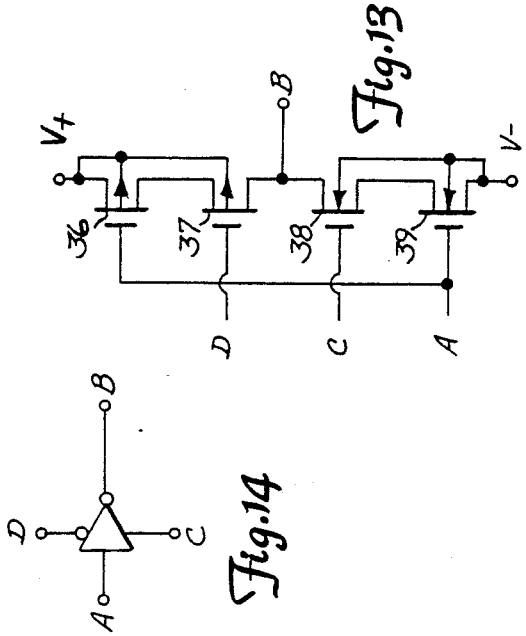
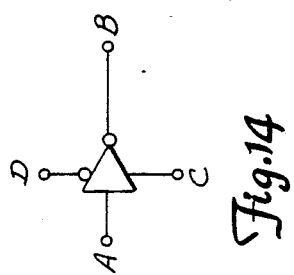
Fig.12
Fig.13
Fig.14

MULTIPLE CHANNEL ANALOG-TO-DIGITAL CONVERTERS

BACKGROUND OF THE INVENTION

This invention relates to analog-to-digital converters using multiple conversion channels to increase the conversion rate, and more particularly, to reducing errors in such conversion arrangements.

Analog-to-digital converters are used to provide a sequence of digital code representations of numbers in any number base where each of such numbers corresponds to a point on an analog (varying only continuously with time) input signal waveform occurring with respect to a reference. That is, the digital code representation of a sequence of numbers is related to the magnitudes of a corresponding sequence of points in the analog input signal and to the fixed magnitude of a reference level signal.

Such analog-to-digital converters compare the magnitude taken by the analog input signal at a point in time to the reference level magnitude and attempt to provide an approximation of this relationship in a short sampling time interval by a digital code representation. This conversion process may be expressed by the analog input signal magnitude being taken equal to the product of the reference level, the output "estimating number" that is represented by the digital code representation, and a "transfer function parameter" which is just equal to the number 1 for linear converters. However, this transfer function parameter may vary as a function of estimating numbers found earlier in the conversion process, or as a function of the current or earlier analog input signal magnitudes, or both, to thereby result in a nonlinear converter.

The input signal and the reference signal may each be nearly any analog quantity such as voltage, current, charge, etc. while the estimating number and the transfer function parameter will usually be dimensionless. However, if the analog input signal is a physical variable of a type differing from that representing the reference signal, the transfer function parameter will be of units which relate the two signals, e.g. ohms if the input signal is in volts and the reference signal is in amps.

FIG. 1 provides a graph (broken-line 1) of a typical relationshiop between analog input signal magnitude, x, and the corresponding converter output estimating number, $\hat{x}$. This "staircase" graph is commonly known as the "quantizing characteristic" and relates the various quantization levels provided by the converter, each of which is represented by some digital code, to a corresponding subrange of analog input signal magnitudes. Here in FIG. 1, the various quantized output levels in the range for graph 1 are shown as being R in number ranging from 0 through R−1. The number of quantization levels in the quantizing characteristic for a given analog input signal magnitude range determines the the number of corresponding subranges in this range, and so is related to the size of the subranges or increments in the input signal magnitude which the converter can distinguish between, i.e. the resolution of the converter.

Also shown in FIG. 1 is the "characteristic line" for this analog-to-digital converter labelled (1), this being a "linear" converter in that the various magnitudes of $\hat{x}$ are sufficiently close to the nominal corresponding values of x. Characteristic lines are usually defined by the line passing through the midpoints of the first and last output quantization transitions, that is, the first and last vertical segments in the quantizing characteristic. The slope of the characteristic line is the "gain" of the converter, and the intercept of the characteristic line with the x axis is the converter "offset". Alternatively, the characteristic line can be defined by the use of statistical methods to provide a line which optimally, in some sense, best represents the quantizing characteristic. Typically, that will be the line which reduces the mean squared error of the quantizing characteristic about the characteristic line to a minimum.

The quantizing characteristic (2) and characteristic line (2) of a second converter are also shown in FIG. 1. There is an error in the response to input signals of the second converter which is an error in gain because of different slopes between characteristic line (2) of this converter and the desired characteristic line of a converter which is that shown for converter 1. The second converter also shows an offset error because of displacement of characteristic line (2) from the zero value on the x axis.

The linearity of an analog-to-digital converter intended to be linear indicates the degree with which the estimating numbers represented by the digital codes provided by the converter in response to input signals accurately reflect the magnitudes of such input signals excluding any gain or offset errors. Expressions of linearity are usually based on the nominal quantizing step increment. Departures from exact linearity, termed linearity errors or nonlinearities, are usually caused by some components in the converter not being matched in electrical characteristics. This leads to a quantizing characteristic which is either (i) not uniform in the increments of the quantizing steps, usually termed differential nonlinearity, or (ii) is not uniform in its distribution about an associated characteristic line, usually termed integral nonlinearity, or which exhibits a combination of both differential nonlinearity and integral nonlinearity.

Turning to FIG. 2, more precise definitions of differential nonlinearity and integral nonlinearity can be given. Differential nonlinearity is defined as the maximum absolute difference between the nominal step increment and any $x_{i+1}-x_i$. Integral nonlinearity is defined as the maximum absolute difference between any $x_{cl\ intsct,i}-x_i$ or any $x_{i+1}-x_{cl\ intsct,\ i}$ and one half of the nominal step increment, where $x_{cl\ intsct,i}$ is the value of x at the point the quantizing characteristic is intersected by the associated characteristic line between the analog input signal increment points $x_i$ and $x_{i+1}$.

In extreme cases, these nonlinearities can result in a "missing code error" as is shown in FIG. 3, or in converter behavior which is not monotonic as is shown in FIG. 4. In FIG. 3, for instance, one estimating number and its corresponding digital code is never presented because the quantizing characteristic is so maldistributed, while in FIG. 4 estimating numbers are presented which are not always monotonically related to the input signal.

A further aspect of analog-to-digital converters of major interest is the rate at which digital code representations can be provided of magnitudes ocurring in the analog input signal, i.e. the conversions per second which the converter can supply. This is of major interest because each conversion provides a digital code output which represents the best estimate of a sample of the magnitude of the analog input signal at a point in time. The well-known sampling theorem requires that the sampling frequency be at least twice the highest frequency component contained in the analog input signal if that signal is to be accurately represented by the sum of the samples thereof represented by the analog-to-digital converter sequence of output digital code representations. Thus, the maximum conversion rate of an analog-to-digital converter, that is, the rate the converter can achieve without significant degradation in its performance, sets a limit on the frequency content of any analog input signal which is to be accurately converted into a sequence of digital code representations.

In addition to not unacceptably limiting the rapidity of variation in time of a time varying analog input signal, the dynamic performance of an analog-to-digital converter must not introduce an unacceptable amount of noise into the converter output representation of the analog input signal. Often, such a converter is evaluated based upon the spectrum of its output sequence of digital code representations when reconstructed by a laboratory quality digital-to-analog converter into an analog signal. Comparison of the frequency spectrum of such a reconstructed output with the frequency spectrum of the original analog input signal allows a determination to be made of such converter dynamic behavior.

If the analog-to-digital converter is essentially ideal, the spectrum of the reconstructed output will (for frequencies up to half of the conversion or sampling rate, i.e. the Nyquist frequency) be just that of the analog input signal plus the addition of a noise component determined by the resolution of the converter. This additional noise component is caused by the analog-to-digital converter unavoidably incurring some error in the digitizing process because the converter has a finite resolution. This finite resolution leads to a quantizing error which will occur even if the converter is otherwise exhibiting perfect behavior.

If there are no significant nonlinearities, such as differential nonlinearities or integral nonlinearities, and if the analog input signal is not phase-locked, that is, synchronous, with the analog-to-digital converter sampling rate, then the additional noise component is determined only by the number of quantizing steps resolvable by the converter and appears in the form of white noise for a linear converter. If the converter also exhibits some nonlinearities, an additional digitizing error occurs which appears as harmonic distortion in the reconstructed output signal.

Analog-to-digital converters of a very wide variety are known, but for most converters the estimating numbers and the corresponding digital code representations are determined by comparing the analog input signal with one or more internally generated signals which are derived from the reference level, usually a fixed value level. (A varying reference level is sometimes used to achieve division of the analog input signal by the varying reference signal.) Each estimating number obtained corresponds more or less with one subrange of magnitudes possible to be taken by the analog input signal over its magnitude range, and the end points of such a subrange correspond with values of such internally generated signals. Through a parallel or sequential procedure for comparing the analog input signal magnitude found in a sample with the various possible internally generated signal values, the subrange of magnitudes which contains the magnitude of the analog input signal is selected by the converter. Once this "best estimate" of the analog input signal sample magnitude is determined, the digital code representation uniquely associated with this magnitude subrange is then typically presented at the converter output.

In sequentially proceeding converters, approximations of an analog input signal magnitude sample are made sequentially in time with each approximation being followed by a comparison between the sample magnitude and the current estimate. Based upon this comparison, the approximation is modified so that a new estimate is made which is either closer to the value of the sample magnitude or which "brackets" such magnitude value with respect to the previous estimate. "Bracketing" of the sample magnitude will occur when the previous estimate was too small (or too large) and the succeeding estimate was too large (or too small) giving a known region of uncertainty within which the analog input signal sample magnitude occurs.

In this way, each new comparison results in an estimating value which is closer than the previous estimating value to the analog input signal sample magnitude, or results in a bracketing of the sample magnitude by an ever decreasing amount. The modification of the estimating value may be in constant increments as in the case of an "integrating" or "counting" converter, or may become successively smaller as in a "successive-approximation" converter. Once the present approximation sequence is completed, a corresponding digital representation is provided, and a new sample of the analog input signal can be taken and the approximation sequence then repeated.

In a parallel proceeding converter, or "flash" converter, the comparison procedure occurs in one step or perhaps, at most, a few sequential steps. The basic flash analog-to-digital converter technique employs $2^n-1$ voltage sources, $2^n-1$ approximately simultaneously operating voltage comparators, and miscellaneous encoding circuitry to achieve an n-bit, binary number digital code representation of an analog input signal sample in a single step. This step is then repeated for each new sample. Such a system is shown in FIG. 5 wherein an overflow output from an additional voltage source and comparator is shown provided to the encoding circuitry to indicate those instances in which the analog input signal sample magnitude exceeds the converter input range.

The voltage sources are typically provided in simplest form by a string of $2^n$ resistors, 10, connected between two reference value voltage supplies, 11 and 12, shown as having fixed voltage values of $V_{R+}$ and $V_{R-}$, respectively, in a voltage divider arrangement. Thus, each of the voltage sources or reference signals are the voltages appearing at the connections between the resistors in string 10 except for the overflow reference signal which is equal to $V_{R+}$. The analog input signal, $V_{in}$, is supplied at an input, 13.

Alternatives to a resistive voltage divider arrangement for providing reference voltage sources are many. For instance, field-effect transistors can be operated as controlled vaue resistance, one of which could be substituted for each of resistances 10. For that matter, an actual resistor, such as a field-effect transistor, or any other arrangement substantially a resistor electrical equivalent could serve as an effective resistance for each of resistors 10. Another possibility for providing reference voltage supplies would be a series of independent voltage sources. Any other arrangement which provides fixed value voltages over at least a small time interval to serve as reference voltages would be suitable.

The set of $2^n$ comparators, 14, are shown in FIG. 5 to each have three inputs in addition to at least a pair of electrical energization inputs for supplying electrical energy thereto which are not shown. The three inputs shown are an inverting input, a non-inverting input and, between them, a clocking input. A signal of a polarity applied to a comparator inverting input tends to force the comparator output signal toward the opposite polarity while the same signal applied to the non-inverting input tends to force the comparator output signal to a value of the same polarity. These results occur, however, only when permitted by clocking signal $\phi$ from a clocking signal source, 15, to which the comparator clocking inputs are shown connected. One of the inverting or non-inverting inputs of each comparator is connected to a corresponding intersection between two of the resistors in resistor string 10 to obtain a reference signal therefrom, and the remaining one of these inputs is connected to input 13.

The comparators of set 14 typically each comprise a substantially linear voltage amplifier of a selected gain having an inverting input and a non-inverting input and an output. A signal of a polarity applied to the amplifier inverting input forces the output signal to the opposite polarity while such an input signal at the non-inverting input forces the output signal to a value of the same polarity. Such an amplifier is followed in cascade by a threshold switch having an input electrically connected to the amplifier output. The threshold switch will have an output which will be in one voltage state when the input thereto has a voltage signal thereon that is less than a first threshold value, and will be in a second or opposite voltage state when the voltage at the input thereof is greater than a second threshold value. If there is no significant hysteresis in the threshold switch, the first and second threshold values will be substantially equal.

Thus, each comparator determines whether the converter analog input signal voltage magnitude at its inverting or non-inverting input (also the amplifier inputs), as the case may be, is greater or smaller than the magnitude of the reference signal present at the other input. This determination is reflected by the voltage state occurring at the comparator or threshold switch output. This comparison is made, however, only when the clocking signal $\phi$ supplies an appropriate impulse to comparators 14 to permit them to make and pass along the results of such a comparison.

The outputs of each of the comparators are connected to encoding circuitry, 16, so that the results of the comparisons are passed on to the logic circuitry therein. In the simplest case, this logic circuitry senses all the comparators which have a first voltage state output versus all the comparators which have a second voltage state output and uses this information to uniquely define an n-bit binary number output code at the encoding circuitry output, 17. Alternatively, a coding scheme based on other than binary numbers such as a gray code may be used.

The use of threshold switches permits a stable logic state to be established which then accurately represents whether the linear amplifier output signals are above or below the threshold values of the threshold switches. Thus, the comparators can provide a decision as to whether $v_{in}$ exceeds or not the corresponding reference signal in a short time period prior to the threshold switch output signal being permitted by the clocking signal to be sent to the encoding circuitry.

In some converter arrangements, the threshold switch is merged with the linear amplifiers to form specific comparators as is shown in FIG. 5. On the other hand, FIG. 5 could have been interpreted so that the comparators 14 were just linear amplifiers with the threshold switches merged with the encoding circuitry, or even that logic gates in the encoding circuitry serve also in some instances as the threshold switches. In such instances, the clocking signal would be supplied to encoding circuitry 16 rather than as shown in FIG. 5.

A further possibility for the linear amplifiers is the use of a single input in place of the noninverting and inverting inputs with this single input switched back and forth at an appropriate rate between the corresponding reference voltage and $v_{in}$. Such amplifiers are common in "switched capacitor" circuitry and are often termed "clocked amplifiers".

In any of these arrangements, the primary requirement is that the clock skew, or variation in switching timing upon the occurrence of an enabling pulse in clock signal $\phi$ between the various comparators, be small so that the sample being taken of the analog input signal is substantially the same at each of the comparators. Variations in threshold values between the various threshold switches is usually not of great importance as the difference in the signals supplied to the inverting and non-inverting inputs of the linear amplifiers have already been amplified on reaching the input to the threshold switch. As a result, this difference has been made either quite positive or quite negative with respect to the threshold values of the switches so that small differences between these threshold values will be insignificant.

Parallel proceeding converters are typically used when higher conversion rates are important because all of the comparisons are made at once, or nearly so, rather than being made successively as in sequentially proceeding converters which takes longer. Further steps in speeding the conversion rate of parallel converters are available such as minimizing the delay through the elements of the converter, and by "pipelining" or overlapping in time some parts of the conversion processing. Nevertheless, as technology advances lead to the desire to convert signals of higher and higher frequency, there is a strong desire to increase the maximum conversion rate in analog-to-digital conversion.

SUMMARY OF THE INVENTION

The present invention provides plural, interleaved-in-time signal conversion channels having common reference signals. Such signal conversion channels may also have common component portions. These measures reduce the degradation in dynamic converter performance by reducing the degradative effects due to mismatches in gain, offset and nonlinearities. Further, by adjusting the timing for these signal conversion channels, degradation due to timing differences is also reduced.

BRIEF DESCRIPTION OF THE DRAWINGS

FIGS. 12, 13 and 14 show an embodiment of a portion of the invention shown in FIG. 11.

DESCRIPTION OF THE PREFERRED EMBODIMENT

Figure 1:
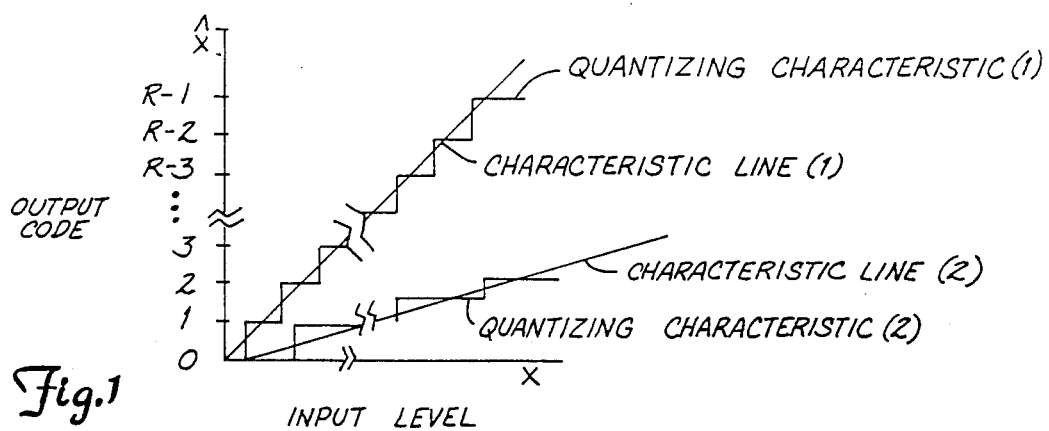
FIG. 1 shows graphs of analog-to-digital converters.
Figure 2:
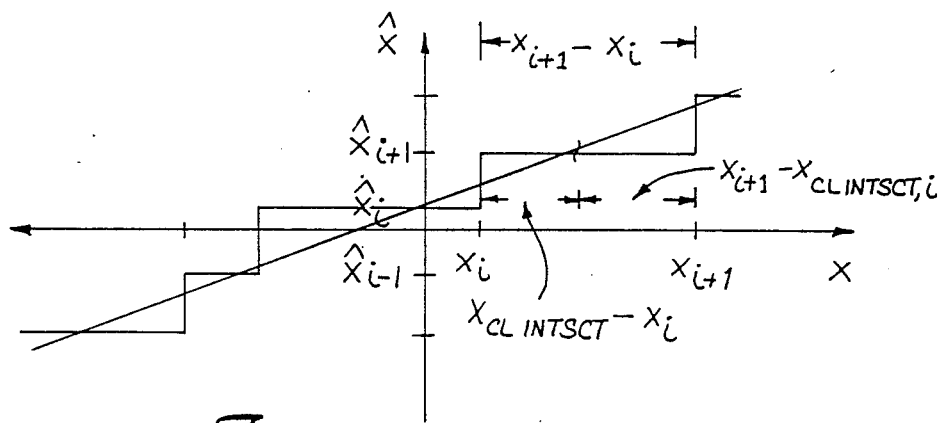
FIG. 2 shows a portion of a graph of the analog-to-digital converter.
Figure 3:
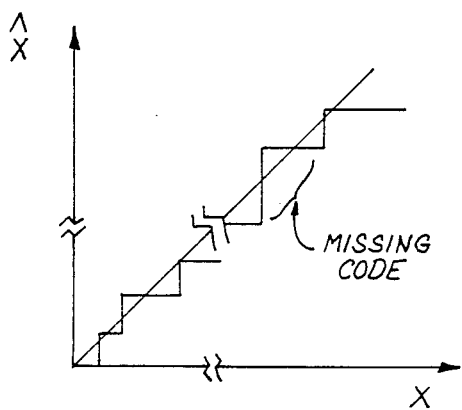
FIGS. 3 and 4 show graphs of analog-to-digital converters.
Figure 4:
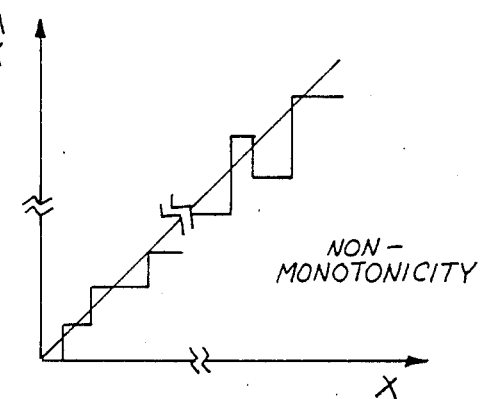
Figure 5:
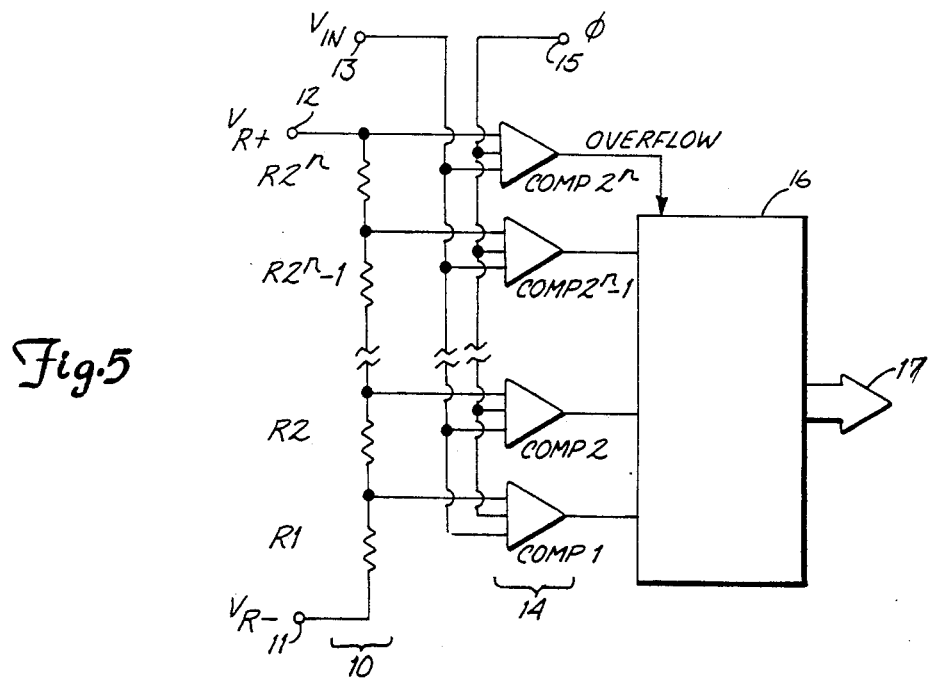
FIG. 5 shows a parallel proceeding or "flash" analog-to-digital converter.
Figure 6:
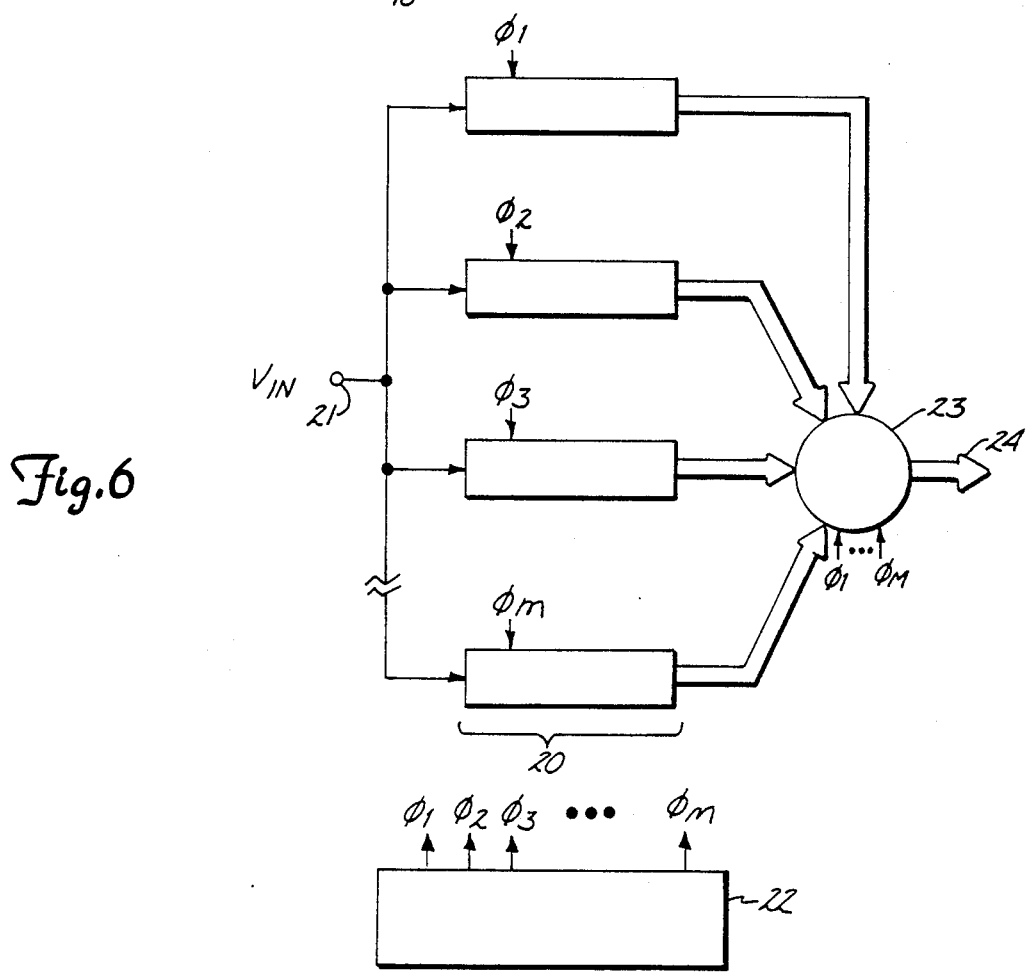
FIG. 6 shows an analog-to-digital converter having plural, interleaved-in-time signal conversion channels.

A further method for increasing the conversion rate for analog-to-digital conversions is to provide an analog-to-digital system using multiple individual analog-to-digital converters with each individual converter periodically sampling the same analog input signal at different phases during a period. The individual converters, thus, each have their conversion process interleaved in time so that any one converter is beginning its next conversion before one or more previously sampling converters have finished the conversion processes that were begun with the converters taking previous samples. Such a conversion system arrangement is shown in FIG. 6 where m individual converters, 20, are indicated each receiving the analog input signal $v_{in}$ from input terminal 21. Each one of individual converters 20 forming the analog-to-digital conversion system of FIG. 6 may be just that which is shown in FIG. 5, or they may be some other kind of analog-to-digital converter such as a successive approximation converter.

Each one of individual converters 20, however, has an individual clocking signal applied at a clocking signal input thereto obtained from a clocking signal generator, or timing generator, 22. Clocking signal generator 22 provides m clocking signals $\phi_1$ through $\phi_m$ each of which is a substantially periodic clocking signal, all being of a common period, but which may be provided for only a limited time duration. These clocking signals differ from one another, however, in that the activating pulse provided in each to permit the analog-to-digital converter to which it is supplied to undertake its conversion process appears with a different phase in each clocking signal.

If the phase of the activating impulse in each clocking signal advances from that of the previous clocking signal for clocking signals $\phi_1$ through $\phi_m$, converters 20 will sequentially sample analog input signal $v_{in}$ as the activating impulses sequentially appear at the clocking inputs of each individual converter and these converters will sequentially provide digital code representations at the converter outputs corresponding to the samples taken. Since the conversion process in any one of converters 20 can begin even though the conversion process in previously sampling converters has not yet ended, a considerable increase in conversion rate can be effected with the system of FIG. 6. This increase will be such that the system of FIG. 6 can provide conversions at a rate which is approximately equal to the rate of any one of converters 20 multiplied by m the total number of converters present.

Although a system which receives digital representation for signal processing following the conversion system of FIG. 6, and which is to use these digital code representations provided by converters 20 may be interested in connecting to each converter individually, the typical situation will be as shown in FIG. 6 where the conversions are to be sequentially presented on the same output or a reduced number of outputs. To provide for this, there is shown in FIG. 6 a data selector, 23, which has as inputs the outputs from each of converters 20. Also, data selector 23 has inputs to receive the clocking signals $\phi_1$ through $\phi_m$ so that data selector 23 can provide sequentially at its output, 24, these digital code representations provided sequentially by converters 20.

Unfortunately, the analog-to-digital conversion system of FIG. 6, however, does not solely provide advantages without any disadvantage. At the very least, such a system will result in a degraded dynamic performance compared with that of any one of converters 20 if each of converters 20 does not match in gain, offset, nonlinearities and clock skew.

Figure 7:
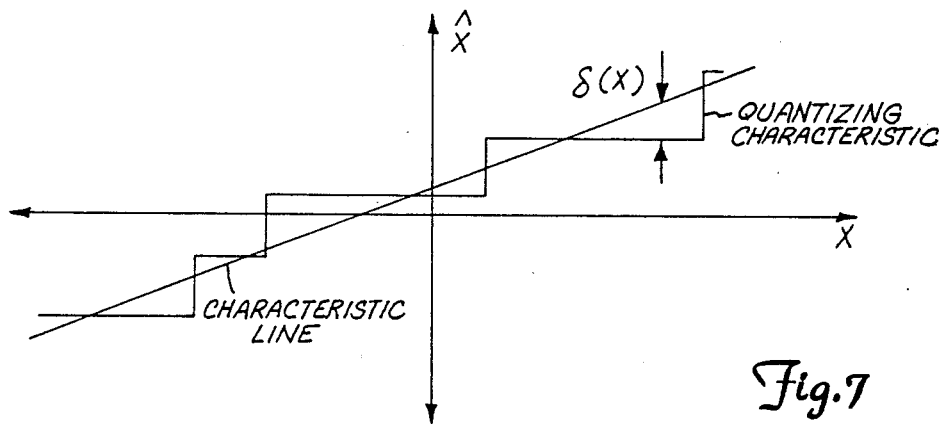
FIG. 7 shows a portion of a graph of an analog-to-digital converter.

A measure of the accuracy of an individual converter from among converters 20 in FIG. 6 can be determined with the aid of the graph of FIG. 7. This graph again shows the quantizing characteristic and the characteristic line for such a converter. The quantizing error for any magnitude of the analog input signal, x, is $\delta(x)$ which is just the difference between the quantizing characteristic and the characteristic line. The well-known "mean squared error" statistical measure is a good indicator of the converter accuracy, or lack of accuracy, and is just the time average of the quantizing errors squared.

In determining the mean squared error for such an individual converter, the characteristic line shown in FIG. 7 should be such that this error is minimized. This can be accomplished through having the characteristic line determined using statistical regression rather than determined just by intersections with the end points of the quantizing characteristic. From well-known statistical analysis, the mean squared error is known to be minimized when the slope, a, and the intercept, b, of the characteristic line are determined by the following equations:

$$a = \frac{<\hat{x}x> - <\hat{x}><x>}{<x^2> - <x>^2}$$

and $$b = <\hat{x}> - a<x>,$$

where $\hat{x}$ refers to the estimating number of the analog input signal provided by the analog-to-digital converter, x is the analog input signal value, and $<\ >$ indicates the time average. The mean squared error for an individual converter can then be expressed as the following:

$$\mathrm{MSE} = <\delta^2(x)> = <[\hat{x}-(ax+b)]^2>.$$

Figure 8:
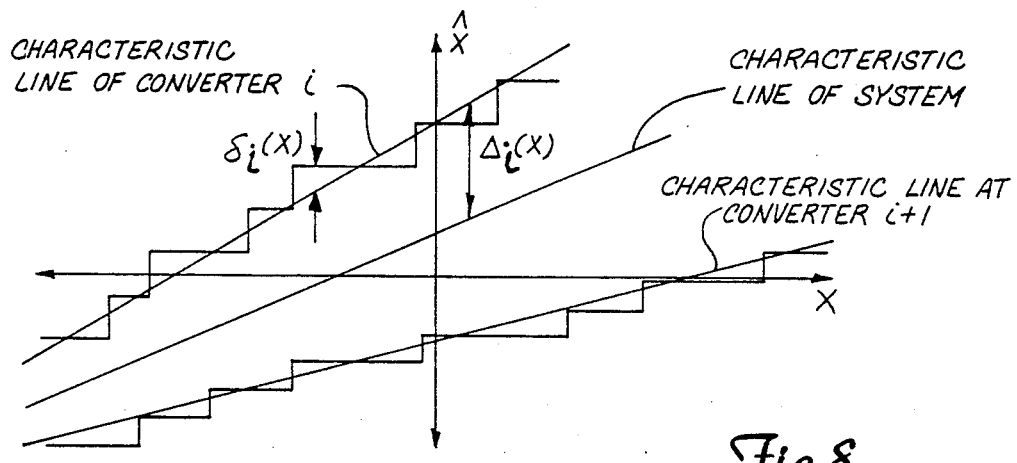
FIG. 8 shows a portion of graphs for an analog-to-digital converter having plural, interleaved-in-time conversion channels and a portion of a composite graph for such a converter.

The mean squared error for the system of FIG. 6, using all of converters 20, can be determined with the aid of the graph of FIG. 8. Each of individual converters 20 has a quantizing characteristic and characteristic line such as that shown in FIG. 7, but they differ from one another because of mismatches in gain, offset and nonlinearities. Further, clock skew in the clocking signals supplied to each converter will adversely affect the system mean squared error.

For FIG. 8, there is shown, as examples from among converters 20, the characteristic line and the corresponding quantizing characteristic of two converters, i and i+1. The characteristic line and quantizing characteristic shown for each of these two converters differ because of obvious mismatches in gain and offset, and because of not so obvious mismatches in nonlinearities which affected the best choice fit for each of the characteristic lines.

A characteristic line for the entire system of FIG. 6 can be found where the slope thereof, $a_{min}$ and the intercept, $b_{min}$, can be determined by including all of the data points for all of converters 20 in a regression analysis which leads to equations again of the general nature shown for an individual converter above. In fact, $a_{min}$ and $b_{min}$ are simply the averages of the slopes and offsets of all of the individual characteristic lines of each of converters 20.

Note that there is an additional term in the error expression for any particular converter of converters 20 from a system viewpoint because the quantizing characteristic thereof not only differs from the characteristic line thereof but also from the characteristic line of the system. This error may be expressed as the following for converter i:

$$e(x) = \delta_i(x) + \Delta_i(x),$$

where $$\delta_i(x) = \hat{x}_i - (a_i x + b_i)$$

and $$\Delta_i(x) = (a_i - a_{min})x + b_i - b_{min}$$

Thus, the mean squared error for the system can be expressed in the following manner:

$$MSE = <e^2(x)> = \frac{1}{m} \sum_{i=1}^{m} <[\Delta_i(x) + \delta_i(x)]^2>.$$

In the usual circumstances, this expression may be simplified to the following:

$$MSE = \frac{1}{m} \sum_{i=1}^{m} [<\Delta_i^2(x)> + <\delta_i^2(x)>].$$

Comparing this last system expression with the expression above for the mean squared error of an individual converter clearly shows that additional error terms appear in the system equation for mean squared error. This arises from differences between converters among converters 20 of FIG. 6 in gain and offset and in nonlinearities. All practical converters invariably exhibit at least some nonlinearity due to component mismatches, so that system performance of the system of FIG. 6 will nearly always be worse than that of an individual converter from among converters 20 unless the nonlinearities may be made to track or be made identical.

Note that for small analog input signal magnitudes centered about a fixed magnitude value, differences in the quantizing characteristics for each of the converters among converters 20 occuring at that fixed value will result in an output from the system that "dithers". This is because of each converter providing a different estimated value for approximately the same analog input signal magnitude.

Also, if each of converters 20 is not sampling the analog input signal at exactly periodic intervals relative to each other, further additions to the mean squared error indicated above must be made. The analysis of this situation, not given here, indicates that this will be a further significant additional source of error.

Thus, these increases in error by use of a system such as that of FIG. 6 can be considerably reduced by assuring that the mismatches between critical components of each of converters 20 is small or neglible. This assurance can be best provided by using the same components that are critical to such matching for all of the converters shown in FIG. 6. A first improvement in the mismatch situation is to use a common set of reference signals for the converters shown in FIG. 6.

If flash converters, such as that shown in FIG. 5, is the kind of converter desired for the individual converters in FIG. 6, a single series string of resistors can be used to assure that the reference signals are identical for all converter apparatuses used in the system.

Figure 9:
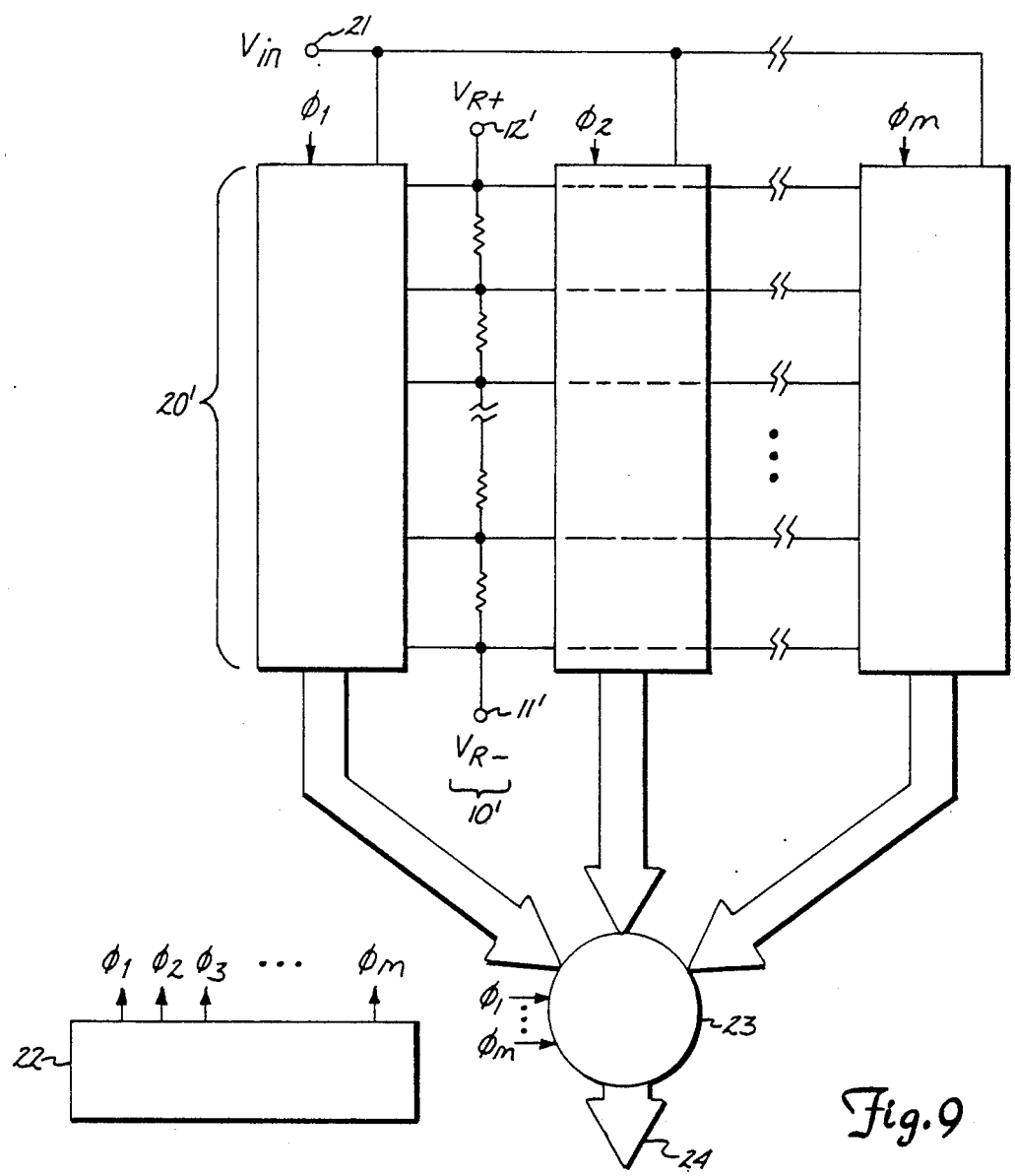
FIG. 9 shows an embodiment of the present invention for an analog-to-digital converter having plural, interleaved-in-time signal conversion channels.

Such an arrangement is shown in FIG. 9 where a series resistor string, 10', is again shown having terminals, 11' and 12', to receive fixed value voltages $V_{R-}$ and $V_{R+}$. The reference voltages obtained at the intersections of the resistors in series string 10' are supplied to each of the m signal conversion channels, 20'. These signal conversion channels, while not any longer individually complete analog-to-digital converters, contain all that is shown in FIG. 5 in each of them except for the series resistor string 10.

The arrangement of FIG. 9 is especially useful in the situation of flash converters because all of the resistor interconnection points providing reference signals are in use all of the time. But a similar arrangement as that shown in FIG. 9 can be used where successive approximation converters are the kind desired for converters 20 in a system of the nature of FIG. 6 where only one tap at a time per converter is being used as long as that is common to each converter.

Similarly, combinations of parallel and sequential converters may employ more than one tap being used at a time for a converter but less than all of the taps being used all of the time such as in a flash converter. Again, these taps can be provided to each converter to achieve the benefits suggested by the system of FIG. 9.

Arranging further components in each signal conversion channel to be common to all of the channels will provide further reductions in mismatch, and so improve performance where these components are important to the mismatches otherwise occuring between each channel. Again, for the case where the converter type for each of converters 20 of the system of FIG. 6 is desired to be a flash converter of the nature shown in FIG. 5, the comparators 13 of FIG. 5 may be made common to each of the individual signal conversion channels as is shown in FIG. 10 where they are now designated 13'.

Figure 10:
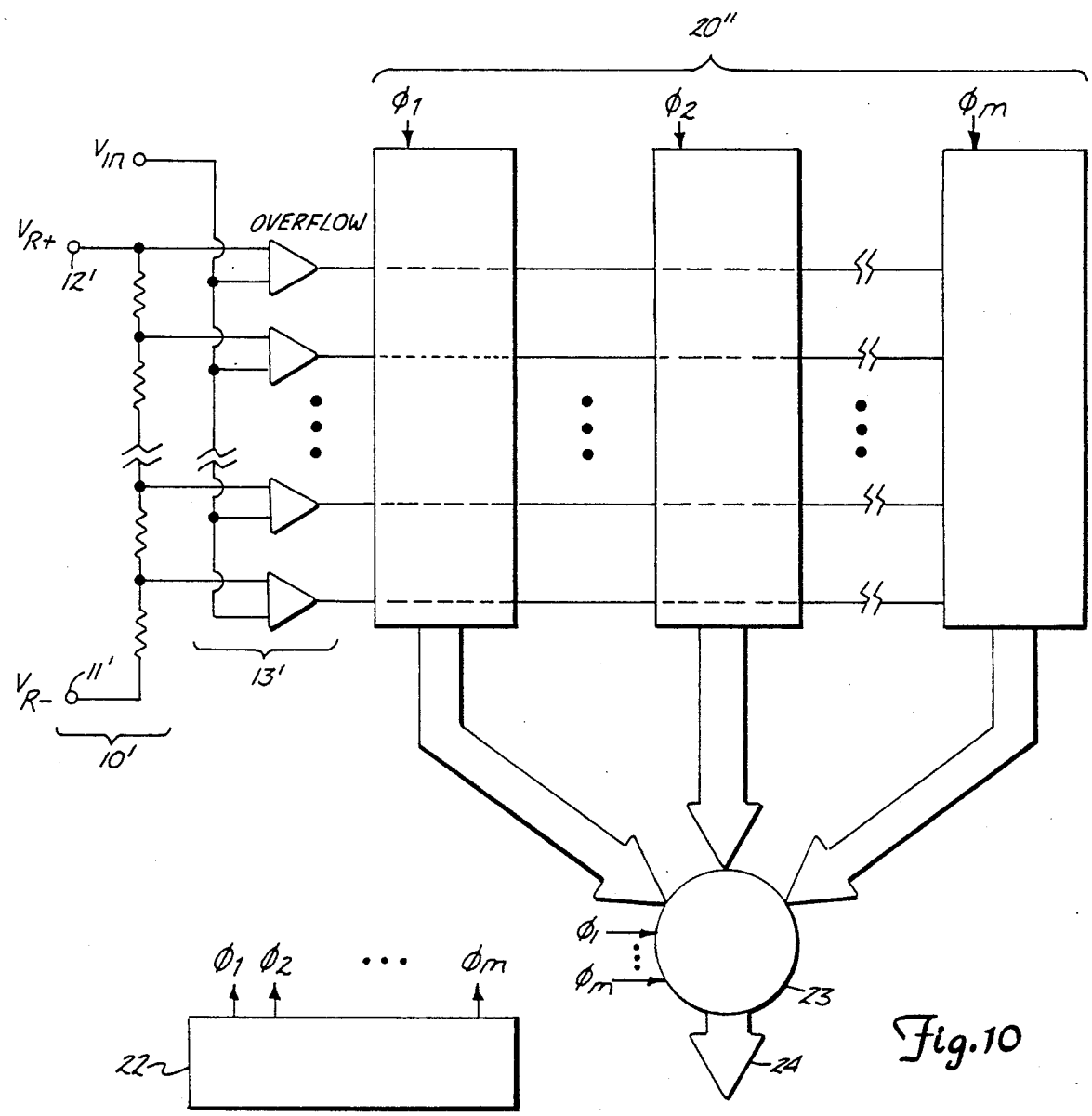
FIG. 10 shows another embodiment of the present invention for analog-to-digital converter having plural, interleaved-in-time signal conversion channels.

Since, as indicated above, mismatches between the threshold values of the various threshold switches are not critical, the threshold switches are likely to be merged individually with each of the remaining portion individual signal conversion channels 20", and so 13' will designate just linear amplifiers in FIG. 10. Sharing common linear amplifiers by the individual signal conversion channels removes the nonlinearities, gain errors and offset errors due to amplifier offset mismatches to thereby improve conversion system performance. For other kinds of converters, rather than flash converters, being used for converters 20 in the system of FIG. 6, those portions which operate in parallel during the conversion proceedings may also be used as a single common portion by the remaining portions of the signal conversion channels.

As shown in FIGS. 6, 9 and 10, the clocking signals must be provided individually to (i) the individual converters 20 as separate signal conversion channels, or to (ii) these remaining portions of converters 20' and 20", that is, the portions that are not a common part of the conversion apparatus, also serving as separate signal conversion channels. This is because each of these separate signal conversion channels must each individually provide a conversion proceeding at a different phase during the clocking signal generator period if an increased conversion rate is to result. As such, there is not generally a parallel use of the clocking signals of the clocking signal generator which may be shared by the various signal conversion channels as a basis for removing clock skew, i.e. the mistimings in the activating impulses in each signal conversion channel clocking signal or phase errors.

Figure 11:
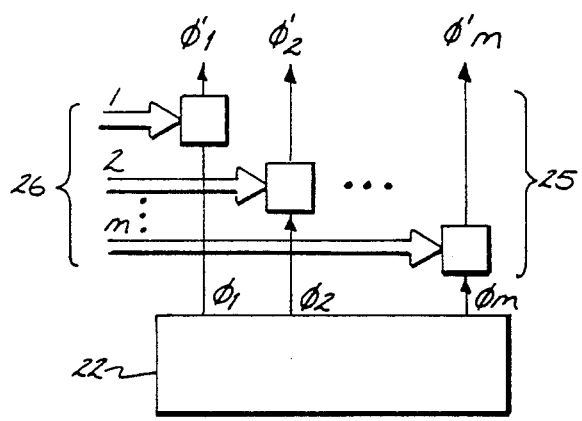
FIG. 11 shows another embodiment of the present invention for analog-to-digital converters having plural, interleaved-in-time signal conversion channels.

Nevertheless, FIG. 11 shows a timing system which provides a reduction in clock skew to improve conversion system performance. The signal conversion system of FIG. 6 is again shown in FIG. 11 but with the addition of selectively set phase adjusters, 25, between clocking signal generator 22 and individual converters 20, i.e. the individual signal conversion channels. These phase adjusters may each be any pulse delay circuit in which the time delay can be selected to thereby adjust the phase of the activating impulses in each clocking signal $\phi_1$ to provide an adjusted clocking signal, $\phi'_i$. The selecting signals, or control signals, are supplied along control signal paths, 26.

The selecting of the necessary control signals to set the desired delays may be accomplished, with a proper choice of delay circuits, either during manufacturing of the conversion system or at a later time during use. If the selecting of the control signals can be based upon information obtained during previous manufacture of the same kinds of units, then systematic phasing errors introduced in the manufacturing process can be corrected. Otherwise, the selecting of the control signals can be based upon clock skew measurements made during tests, or upon simply adjusting the clocking skew to the point of optimal conversion system performance.

A circuit which, as an example, can be used for one of adjusters 25, the $i^{th}$ one, is shown in FIG. 12 where clocking signal $\phi_i$ is received at an input terminal, 30, and an adjusted clocking signal $\phi'_i$ is provided at an output terminal, 31. The $i^{th}$ control path, here designated $26_i$, comprises four logic signal control lines, shown in FIG. 12 as terminals for signals $x_0$, $x_2$ and $x_3$.

The phase adjuster shown in FIG. 12 comprises four complementary metal-oxide-semiconductor (CMOS) field-effect transistor inverters (could just as well be inverters of another technology such as n-MOS), these being inverters 32, 33, 34 and 35. These inverters are electrically connected in parallel with each inverter having its input connected to terminal 30 and its output connected to terminal 31. Inverter 32 is the basic, common kind of CMOS inverter having a p-channel metal-oxide-semiconductor field-effect transistor (MOSFET) connected in series with a n-channel MOSFET through having the drains of each of these transistors electrically connected together. The source and substrate of the p-channel transistor is connected to a relatively positive source of voltage, and the source and substrate of the n-channel transistor connected to a relatively negative source of voltage. The input to inverter 32 comprises the gates of the n-channel transistor and the p-channel transistor electrically connected in common, while the output of the inverter is the common drain connection indicated above.

The channel width to length ratio of the transistors in converter 32 are relatively large compared to the ratios for the transistors in each of inverters 33, 34 and 35. Thus, inverter 32 will be of primary importance in controlling the rise and fall times of voltage impulses provided to terminal 31 in response to impulses occurring on terminal 30 because of the resulting better capability of charging and discharging the circuit connected to terminal 31.

Inverters 33, 34 and 35 each have the configuration shown in FIG. 13 comprising two series electrically connected pairs, one pair of source-to-drain connected p-channel MOSFETS, 36 and 37, and one pair of source-to-drain connected n-channel MOSFETS, 38 and 39. The pairs are electrically connected at the drains of transistors 37 and 38. The circuit symbol used in FIG. 12 for the inverter shown in FIG. 13 is depicted in FIG. 14. The input for the inverter shown in FIG. 13 is designated A and is the common connection of the gates of transistors 36 and 39 while the output is designated B and is the common drain connection mentioned above of transistors 37 and 38.

The gates of transistors 37 and 38, designated D and C, respectively, comprise logic control inputs which can be used to selectively enable or prevent the inverter of FIG. 13 from responding at output B to (i) an increase in a signal presented at input A, or alternatively, (ii) from responding to a decrease in signal presented at input A, or (iii) from responding to either of such an increase or decrease. Thus, by providing logic signals to these logic control inputs of inverters 33, 34 and 35, these inverters can be selectively used to assist converter 32 in charging or discharging the circuits connected to terminal 31. The result is to thereby increase or decrease the rise times and fall times of impulse signals on terminal 31 in response to an input impulse signal presented on terminal 30.

That is, an increased delay in an impulse signal provided at terminal 31 by phase adjusting means 25 in response to an input impulse signal occurring on terminal 30 can be made to occur by slowing the rise time, or the fall time, or both, of such an impulse. A decreased delay can be made to occur by decreasing the rise time, or the fall time, or both. Providing control of the impulse transition times individually, i.e. the rise time and the fall time, as opposed to merely controlling the total delay of the impulse, permits an added advantage. This advantage is the opportunity to make the output impulse signal symmetrical in rise time and fall time despite any effects in the circuitry providing the input impulse leading to asymmetry.

Through a proper choice of logic control signals $26_i$ and of some logic gates to implement or control arrangement for inverters 33, 34 and 35, the amount of adjustment in either the rise time or fall time of an impulse provided on terminal 31 in response to an input impulse on terminal 30 can be set. Alternatively stated, the number of logic control inverters 33, 34 and 35 which are selected to be used to assist converter 32 in response to the rising portion of an input pulse, or the number thereof assisting in response to a falling portion of such an input impulse, is set by such a control arrangement. In FIG. 12, the number of logic control inverters 33, 34 or 35 which assist during an output impulse fall time can be set by a choice of logic values for logic signals $x_0$ and $x_1$, while the number which assist during an output impulse rise time can be set by logic signals $x_2$ and $x_3$.

Since signals $x_0$ and $x_1$ together can define four different logic states, a few logic gates can be used with these signals so that (i) one state leads to none of the logic control inverters assisting during the output impulse fall time, (ii) another state leads to one inverter assisting, (iii) a further state leads to two inverters assisting, or (iv) a final state leads to all three inverters assisting. One logic gate arrangement which will accomplish this is shown in FIG. 12 involving two inverters, 40 and 41, and a nand gate, 42, and a nor gate, 43.

Similarly, the logic signals at terminal $x_2$ and $x_3$ can together take four different logic states and so a few logic gates can be used with these signals so that (i) one logic state prevents any of the logic control inverters from assisting inverter 32 during an output impulse rise time, (ii) another logic state permits one inverter to assist, (iii) another logic state permits two inverters to assist, and finally, (iv) the last logic state which permit all three inverters to assist. One arrangement of logic gates which can accomplish this is shown in FIG. 12 involving an inverter, 44, a nand gate, 45, and a nor gate, 46. If use of more than three logic control inverters is desired, additional logic signals and gates would need to be provided. Use of a single logic control inverter would require fewer logic signals.

As an example for the system shown in FIG. 12, assume positive logic, that the logic signals applied to terminals $x_0$ and $x_1$ are each a 1, and that the logic signals applied to terminals $x_2$ and $x_3$ are each a 0. In that circumstance, all three inverters would assist primary inverter 32 in discharging the circuitry connected to terminal 31 to thereby reduce to a minimum the fall time in the impulse occurring on terminal 31 in response to an impulse at input 30. During the rise time of the impulse, however, none of the logically controlled inverters would assist primary inverter 32 in charging the circuitry connected to output terminal 31 so that the greatest impulse rise time would occur in this situation.

The same phase adjustment means for each clocking signal can be provided for the systems shown in FIGS. 9 and 10. Similar reductions in system errors will occur for these systems as for the system of FIG. 6.

The embodiments of the invention in which an exclusive property of right is claimed are defined as follows:

1. An analog-to-digital converter system for converting magnitudes of sequential selected points of at least one analog input signal into corresponding digital code representations, said system having a plurality of signal conversion channels each of which can provide, separately, signal representations corresponding to respective said analog input signal points, if permitted to do so, with any said signal representation chosen depending substantially on where said magnitude of said analog input signal point occurs with respect to a range of magnitudes, said system comprising:

a signal conversion channel decision means having a plurality of portions at least one of which occurs in only one of said signal conversion channels such that said portion provides said signal representation for that signal conversion channel, said signal conversion channel decision means having a signal input for receiving said analog input signal and having a plurality of reference signal inputs such that each said signal conversion channel decision means portion associated with one of said signal conversion channels can provide any said signal representation for that channel depending on whether said magnitude of said corresponding analog input signal point exceeds any, some or all magnitudes of reference signals occuring at said reference inputs if reference signals of various magnitudes are supplied to said reference inputs; and a multiple signal provision means having a plurality of inputs and a plurality of outputs, said multiple signal provision means outputs each having available thereon a secondary reference signal of a selected magnitude if a primary reference signal is provided to at least some of said multiple signal provision means inputs where said multiple signal provision means outputs are connected to said signal conversion channel decision means reference signal inputs in such a manner that any secondary reference signal occurring on such a said multiple signal provision means output is supplied to that said signal channel conversion decision means reference signal input connected thereto.

2. The system of claim 1 wherein said multiple signal provision means comprises a plurality of effective resistors electrically connected in series with said multiple signal provision means outputs occurring at electrical connections between said effective resistors, and said multiple signal provision means inputs occurring at connections to those two of said effective resistors unconnected to others of said effective resistors.

3. The system of claim 1 wherein each signal conversion channel decision means portion comprises a plurality of amplifiers each having at least one input, and having an output, with said amplifier input being electrically connected at least intermittently to a selected one of said signal conversion channel decision means input and said signal conversion channel decision means reference inputs.

4. The system of claim 1 wherein said signal conversion channel decision means has both a common portion and a plurality of channel portions each associated, as aforesaid, with a corresponding said signal conversion channel, said common portion comprising a plurality of amplifiers each having at least one input, and having an output, with said amplifier input being electrically connected at least intermittently to a selected one of said signal conversion channel decision means input and said signal conversion channel decision means reference inputs, and with each of said signal channel conversion decision means channel portions comprising a plurality of threshold switches each having an input and an output with said threshold switch input being electrically connected to a selected said amplifier output, and with each said threshold switch being such that, if electrically energized, said threshold switch output is in one state if electrical signals of a magnitude less than a first threshold value are applied to said threshold switch input and in an opposite state if such electrical signals are of a magnitude exceeding a second threshold value.

5. The system of claim 1 wherein each of said signal channel conversion decision means portions has a clocking signal input and is permitted to provide said signal representation only after receiving a selected clocking signal on said clocking signal input.

6. The system of claim 2 wherein each of said signal channel conversion decision means portions has a clocking signal input and is permitted to provide said signal representation only after receiving a selected clocking signal on said clocking signal input.

7. The system of claim 3 wherein each signal conversion channel decision means portion further comprises a plurality of threshold switches each having an input and an output with said threshold switch input being electrically connected to a selected said amplifier output, and with each said threshold switch being such that, if electrically energized, said threshold switch output is in one state if electrical signals of a magnitude less than a first threshold value are applied to said threshold switch input and in an opposite state if said electrical signals are of a magnitude exceeding a second threshold value.

8. The system of claim 4 wherein each said signal channel conversion decision means channel portion further comprises a code determination means having inputs and outputs with said code determination means inputs being electrically connected to selected said threshold switch outputs, each said code determination means being capable of providing, if electrically energized, a said digital code representation at said code determination means outputs depending on which states occur in said threshold switch outputs connected thereto.

9. The system of claim 4 wherein each amplifier has a non-inverting input and an inverting input, with one of said amplifier inputs being electrically connected to said signal conversion channel decision means signal input, and with that remaining said amplifier input of each of said amplifiers being electrically connected to a selected one of said signal conversion channel decision means reference inputs.

10. The system of claim 5 wherein there is further provided a clocking signal generator having a plurality of clocking signal generator outputs which are electrically connected to said clocking signal inputs, with said clocking signal generator means, if electrically energized, providing a said clocking signal at each clocking signal generator output which is substantially periodic but where each said clocking signal so provided is of a phase differing from that of other such said clocking signals so that each of said signal channel conversion decision means portions is substantially periodically permitted to provide said signal representations.

11. The system of claim 6 wherein there is further provided a clocking signal generator having a plurality of clocking signal generator outputs which are electrically connected to said clocking signal inputs, with said clocking signal generator means, if electrically energized, providing a clocking signal at each clocking signal generator output which is substantially periodic but where each said clocking signal so provided is of a phase differing from that of other such said clocking signals so that each of said signal channel conversion decision means portions is substantially periodically permitted to provide said signal representations.

12. The system of claim 7 wherein each said signal channel conversion decision means channel portion further comprises a code determination means having inputs and outputs with said code determination means inputs being electrically connected to selected said threshold switch outputs, each said code determination means being capable of providing, if electrically energized, a said digital code representation at said code determination means outputs depending on which states occur in said threshold switch outputs connected thereto.

13. The system of claim 7 wherein each amplifier has a non-inverting input and an inverting input, with one of said amplifier inputs being electrically connected to said signal conversion channel decision means signal input, and with that remaining said amplifier input of each of said amplifiers being electrically connected to a selected one of said signal conversion channel decision means reference inputs.

14. The system of claim 8 wherein said code determination means outputs are electrically connected to a data selector.

15. The system of claim 8 wherein each of said signal channel conversion decision means channel portions has a clocking signal input and is permitted to provide said signal representation only after receiving a selected clocking signal on said clocking signal input.

16. The system of claim 10 wherein said clocking signal generator outputs are each electrically connected through delay means to said clocking signal inputs, said delay means being capable of delaying electrical signals transmitted therethrough by a selected amount of time.

17. The system of claim 11 wherein said clocking signal generator outputs are each electrically connected through delay means to said clocking signal inputs, said delay means being capable of delaying electrical signals transmitted therethrough by a selected amount of time.

18. The system of claim 12 wherein said code determination means outputs are electrically connected to a data selector.

19. The system of claim 12 wherein each of said signal channel conversion decision means portions has a clocking signal input and is permitted to provide said signal representation only after receiving a selected clocking signal on said clocking signal input.

20. The system of claim 15 wherein there is further provided a clocking signal generator having a plurality of clocking signal generator outputs which are electrically connected to said clocking signal inputs, with said clocking signal generator, if electrically energized, providing a clocking signal at each clocking signal generator output which is substantially periodic but where each said clocking signal so provided is of a phase differing from that of other such said clocking signals so that each of said signal channel conversion decision means portions is substantially periodically permitted to provide said signal representations.

21. The system of claim 19 wherein there is further provided a clocking signal generator having a plurality of clocking signal generator outputs which are electrically connected to said clocking signal inputs, with said clocking signal generator, if electrically energized, providing a clocking signal at each clocking signal generator output which is substantially periodic but where each said clocking signal so provided is of a phase differing from that of other such said clocking signals so that each of said signal channel conversion decision means portions is substantially periodically permitted to provide said signal representations.

22. The system of claim 20 wherein said clocking signal generator outputs are each electrically connected through delay means to said clocking signal inputs, said delay means being capable of delaying electrical signals transmitted therethrough by a selected amount of time.

23. The system of claim 21 wherein said clocking signal generator outputs are each electrically connected through delay means to said clocking signal inputs, said delay means being capable of delaying electrical signals transmitted therethrough by a selected amount of time.

24. The system of claim 22 wherein said first and second threshold values are each substantially a common value.

25. The system of claim 23 wherein said first and second threshold values are each substantially a common value.

26. An analog-to-digital converter system for converting magnitudes of sequential selected points of at least one analog input signal received at a signal input into corresponding digital code representations, said system comprising:

a plurality of effective resistors electrically connected in series with resistor series outputs occurring at electrical connections between said effective resistors;

a plurality of signal conversion channels each of which can provide, separately, said digital code representations corresponding to respective said analog input signal points, if permitted to do so, and each comprising (i) a plurality of amplifiers each having at least one input, and having an output, with said amplifier input being electrically connected at least intermittently to a selected one of said signal input and said resistor series outputs, and (ii) a plurality of threshold switches each having an input and an output with said threshold switch input being electrically connected to a selected said amplifier output and with each said threshold switch being such that, if electrically energized, said threshold switch output is in one state if electrical signals of a magnitude less than a first threshold value are applied to said threshold switch input and in an opposite state if such electrical signals are of a magnitude exceeding a second threshold value, and (iii) a code determination means having inputs and outputs with said code determination means inputs being electrically connected to selected said threshold switch outputs, each said code determination means being capable of providing, if electrically energized, a said digital code representation at said code determination means outputs depending on which states occur in said threshold switch outputs connected thereto.

27. The system of claim 26 wherein each of said signal conversion channels has a clocking signal input and is permitted to provide said clocking signal representation only after receiving a selected clocking signal on said clocking signal input, and wherein said system further comprises a clocking signal generator means having a plurality of clocking signal generator outputs which are electrically connected to said clocking signal inputs, with said clocking signal generator means, if electrically energized, providing a said clocking signal at each clocking signal generator output which is substantially periodic but where such said clocking signal so provided is of a phase differing from that of other such said clocking signals so that each of said signal channel conversion decision means portions is substantially periodically permitted to provide said signal representations, said clocking signal generator outputs each being electrically connected through phase adjusting means to said clocking signal inputs with said phase adjusting means being capable of selectively adjusting times of occurrence of at least portions of signals provided to said clocking signal inputs in response to signals occurring at said clocking signal generator outputs.

28. The system of claim 26 wherein each amplifier has a non-inverting input and an inverting input, with one of said amplifier inputs being electrically connected to said signal conversion channel decision means signal input, and with that remaining said amplifier input of each of said amplifiers being electrically connected to a selected one of said signal conversion channel decision means reference inputs.

29. An analog-to-digital converter system for converting magnitudes of sequential selected points of at least one analog input signal received at a signal input into corresponding digital code representations, said system comprising:

a plurality of effective resistors electrically connected in series with resistor series outputs occurring at electrical connections between said effective resistors;

a plurality of amplifiers each having at least one input, and having an output, with said amplifier input being electrically connected at least intermittently to a selected one of said signal input and said resistor series outputs; and a plurality of signal conversion channels each of which can provide, separately, said digital code representations corresponding to respective said analog input signal points, if permitted to do so, and each comprising (i) a plurality of threshold switches each having an input and an output with said threshold switch input being electrically connected to a selected said amplifier output and with each said threshold switch being such that, if electrically energized, said threshold switch output is in one state if electrical signals of a magnitude less than a first threshold value are applied to said threshold switch input and in an opposite state if such electrical signals are of a magnitude exceeding a second threshold value, and (ii) a code determination means having inputs and outputs with said code determination means inputs being electrically connected to selected said threshold switch outputs, each said code determination means being capable of providing, if electrically energized, a said digital code representation at said code determination means outputs depending on which states occur in said threshold switch outputs connected thereto.

30. The system of claim 29 wherein each of said signal conversion channels has a clocking signal input and is permitted to provide said clocking signal representation only after receiving a selected clocking signal on said clocking signal input, and wherein said system further comprises a clocking signal generator means having a plurality of clocking signal generator outputs which are electrically connected to said clocking signal inputs, with said clocking signal generator means, if electrically energized, providing a said clocking signal at each clocking signal generator output which is substantially periodic but where such said clocking signal so provided is of a phase differing from that of other such said clocking signals so that each of said signal channel conversion decision means portions is substantially periodically permitted to provide said signal representations, said clocking signal generator outputs each being electrically connected through phase adjusting means to said clocking signal inputs with said phase adjusting means being capable of selectively adjusting times of occurrence of at least portions of signals provided to said clocking signal inputs in response to signals occurring at said clocking signal generator outputs.

31. The system of claim 29 wherein each amplifier has a non-inverting input and an inverting input, with one of said amplifier inputs being electrically connected to said signal conversion channel decision means signal input, and with that remaining said amplifier input of each of said amplifiers being electrically connected to a selected one of said signal conversion channel decision means reference inputs.

32. An analog-to-digital converter system for converting magnitudes of sequential selected points of at least one analog input signal into corresponding digital code representations, said system having a plurality of signal conversion channels each of which can provide, separately, signal representations corresponding to respective said analog input signal points, if permitted to do so, with any said signal representation chosen depending substantially on where said magnitude of said analog input signal point occurs with respect to a range of magnitudes, said system comprising:

a signal conversion channel decision means having a plurality of portions at least one of which occurs in only one of said signal conversion channels such that said portion provides said signal representation for that signal conversion channel, said signal conversion channel decision means having a signal input for receiving said analog input signal, and each of said signal channel conversion decision means portions having a clocking signal input and is permitted to provide said signal representation only after receiving a selected clocking signal on said clocking signal input;

a clocking signal generator means having a plurality of clocking signal generator outputs which are electrically connected to said clocking signal inputs, with said clocking signal generator means, if electrically energized, providing a said clocking signal at each clocking signal generator output which is substantially periodic but where each said clocking signal so provided is of a phase differing from that of other such said clocking signals; and a plurality of phase adjusting means each having an input electrically connected to a clocking signal generator output and each having an output electrically connected to a clocking signal input, with each said phase adjusting means being capable of selectively adjusting times of occurrence of at least portions of signals provided to said clocking signal inputs in response to signals occurring at said clocking signal generator outputs so that each of said signal channel conversion decision means portions is substantially periodically permitted to provide said signal representations.

33. The system of claim 32 wherein a said phase adjusting means is a pulse delay circuit in which various delays can be selected.

34. The system of claim 32 wherein a said phase adjusting means is formed from a plurality of inverters each having signal input and a signal output where such inverters are electrically connected in parallel such that each inverter signal input is connected to said phase adjusting means input and each inverter signal output is electrically connected to said phase adjusting means output.

35. The system of claim 34 wherein at least some of said inverters also have control signal inputs at which control signals can be provided to selectively prevent such inverters from responding to at least some portions of signals provided at said inverter signal input.

36. A signal impulse transition time adjustment circuit having a circuit input and a circuit output, said circuit comprising a plurality of inverters each having a signal input and a signal output where such inverters are electrically connected in parallel such that each inverter signal input is connected to said circuit input and each inverter signal output is electrically connected to said circuit output, and at least some of said inverters also having control signal inputs at which control signals can be provided to selectively prevent such inverters from responding to at least some portions of signals provided at said inverter signal input.

37. The apparatus of claim 36 wherein logic circuit means are provided electrically connected to said control signal inputs to provide said control signals.

* * * * *